US012341038B2

(12) United States Patent
Chary et al.

(10) Patent No.: US 12,341,038 B2
(45) Date of Patent: Jun. 24, 2025

(54) DYNAMIC AND LOCALIZED TEMPERATURE CONTROL FOR EPITAXIAL DEPOSITION REACTORS

(71) Applicant: Applied Materials, Inc., Santa Clara, CA (US)

(72) Inventors: Sathya Shrinivas Chary, San Francisco, CA (US); Zhiyuan Ye, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 486 days.

(21) Appl. No.: 17/573,228

(22) Filed: Jan. 11, 2022

(65) Prior Publication Data
US 2023/0223284 A1    Jul. 13, 2023

(51) Int. Cl.
F27B 17/00    (2006.01)
F27D 3/00     (2006.01)
F27D 5/00     (2006.01)
H01L 21/66    (2006.01)
H01L 21/67    (2006.01)
H05B 1/02     (2006.01)
H05B 3/00     (2006.01)

(52) U.S. Cl.
CPC .... H01L 21/67248 (2013.01); F27B 17/0025 (2013.01); F27D 3/0084 (2013.01); F27D 5/0037 (2013.01); H01L 22/26 (2013.01); H05B 1/0233 (2013.01); H05B 3/0047 (2013.01)

(58) Field of Classification Search
None
See application file for complete search history.

(56) References Cited

U.S. PATENT DOCUMENTS

| 6,123,766 | A  |   | 9/2000  | Williams et al. |
| 6,164,816 | A  | * | 12/2000 | Aderhold ............ G01J 5/0007 374/1 |
| 6,329,643 | B1 |   | 12/2001 | Suzuki et al. |
| 10,770,319 | B2 |  | 9/2020  | Lau et al. |
| 11,021,795 | B2 |  | 6/2021  | Lau et al. |

(Continued)

FOREIGN PATENT DOCUMENTS

| JP | 2007-081348 A | 3/2007 |
| KR | 10-2001-0030160 A | 4/2001 |

(Continued)

OTHER PUBLICATIONS

International Search Report and Written Opinion for International Application No. PCT/US2022/036977 dated Nov. 3, 2022, whole document.

(Continued)

*Primary Examiner* — Khaja Ahmad
(74) *Attorney, Agent, or Firm* — Patterson + Sheridan, LLP

(57) ABSTRACT

A method and apparatus for improving film growth uniformity on a semiconductor substrate. The film growth uniformity is improved by adjusting the amount of power provided to the substrate by spot heaters as the substrate is rotated. Therefore, the amount of power provided to the substrate by the spot heaters changes as the portion of the substrate being heated by spot heater changes. The change in power provided by the spot heater is dependent on a temperature correction factor applied by the controller.

17 Claims, 7 Drawing Sheets

(56) References Cited

U.S. PATENT DOCUMENTS

| | | |
|---|---|---|
| 11,821,088 B2 | 11/2023 | Lau et al. |
| 12,163,229 B2 | 12/2024 | Lau et al. |
| 2008/0213716 A1* | 9/2008 | Koyama ........... H01L 21/67248 |
| | | 432/120 |
| 2009/0101633 A1 | 4/2009 | Aggarwal et al. |
| 2011/0189602 A1* | 8/2011 | Tadokoro ................. G03F 7/38 |
| | | 118/712 |
| 2015/0255356 A1 | 9/2015 | Yao |
| 2017/0103907 A1 | 4/2017 | Chu et al. |
| 2018/0340259 A1 | 11/2018 | Wilson et al. |
| 2019/0127851 A1* | 5/2019 | Lau .................... B23K 26/0006 |
| 2019/0267263 A1 | 8/2019 | Lau et al. |
| 2021/0285105 A1 | 9/2021 | Lau et al. |
| 2024/0044004 A1 | 2/2024 | Lau et al. |
| 2025/0066918 A1 | 2/2025 | Lau et al. |

FOREIGN PATENT DOCUMENTS

| | | |
|---|---|---|
| KR | 10-2011-0078817 A | 7/2011 |
| KR | 20200065096 A | 6/2020 |
| WO | 2019089185 A1 | 5/2019 |

OTHER PUBLICATIONS

Office Action for Korean Application No. 10-2024-7011830 dated Apr. 22, 25.

\* cited by examiner

DYNAMIC AND LOCALIZED TEMPERATURE CONTROL FOR EPITAXIAL DEPOSITION REACTORS

BACKGROUND

Field

Embodiments of the present disclosure generally relates to apparatus and methods for semiconductor processing, more particularly, to a thermal process chamber and spot heater utilization.

Description of the Related Art

Semiconductor substrates are processed for a wide variety of applications, including the fabrication of integrated devices and microdevices. During processing, the substrate is positioned on a substrate support within a process chamber. The substrate support is supported by a support shaft, which is rotatable about a central axis. Precise control over a heating source, such as a plurality of heating lamps disposed below and above the substrate, allows the substrate to be heated within very strict tolerances. The strict control of temperature of the substrate assists in the deposition of uniform layers on the substrate.

Even with control of heating lamps within the process chamber, it is often difficult to obtain uniform film deposition on the substrate. Non-uniformities include areas of greater or less deposition on the substrate. Non-uniformities may be caused by one or more factors, such as non-uniform thermal distribution within the substrate support and the substrate as well as non-uniform precursor flow rates. Therefore, a need exists for improved heating apparatus and methods in semiconductor processing.

SUMMARY

The present disclosure generally relates to a method of adjusting a temperature profile of a substrate during processing, suitable for use during semiconductor manufacturing. The method includes determining a first angular position of the substrate. A plurality of temperature correction factors are provided to a spot heater controller. A first angular section of the substrate is exposed to first radiation beam with a first power using a spot heater. The first power is determined using a first temperature correction factor of the plurality of temperature correction factors. After exposing the first angular section of the substrate, the substrate is rotated about a central axis. After rotating the substrate a second angular section of the substrate is exposed to a second radiation beam with a second power using the spot heater. The second power is determined using a second temperature correction factor of the plurality of temperature correction factors. The second power is different from the first power.

In another embodiment, an apparatus for processing a substrate, suitable for use during semiconductor manufacturing, is described. The apparatus includes a chamber body, a substrate support disposed within the chamber body, a chamber lid, a chamber floor, an upper window disposed between the chamber lid and the substrate support, a lower window disposed between the substrate support and the chamber floor, a plurality of upper lamps disposed between the upper window and the chamber lid, a plurality of lower lamps disposed between the lower window and the chamber floor, one or more spot heaters disposed on the chamber lid and configured to direct a radiation beam towards the substrate support, and a controller. The controller is configured to control the one or more spot heaters and programmed to: determine an angular position of the substrate and adjust a power output of one or more spot heaters using a set of temperature correction factors, such that the power output of one or more spot heaters varies as the spot heaters heat a plurality of angular portions of the substrate.

In yet another embodiment, a non-transitory computer-readable medium is described. The non-transitory computer-readable medium stores instructions that, when executed by a processor, cause a computer system to perform the steps of: determining an angular position of a substrate, receiving a temperature correction curve, and adjusting a power output of one or more spot heaters. Adjusting the power output includes using the temperature correction curve, such that the power output of one or more spot heaters varies as the spot heaters heat a plurality of angular portions of the substrate along a first radial position of the substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1A:
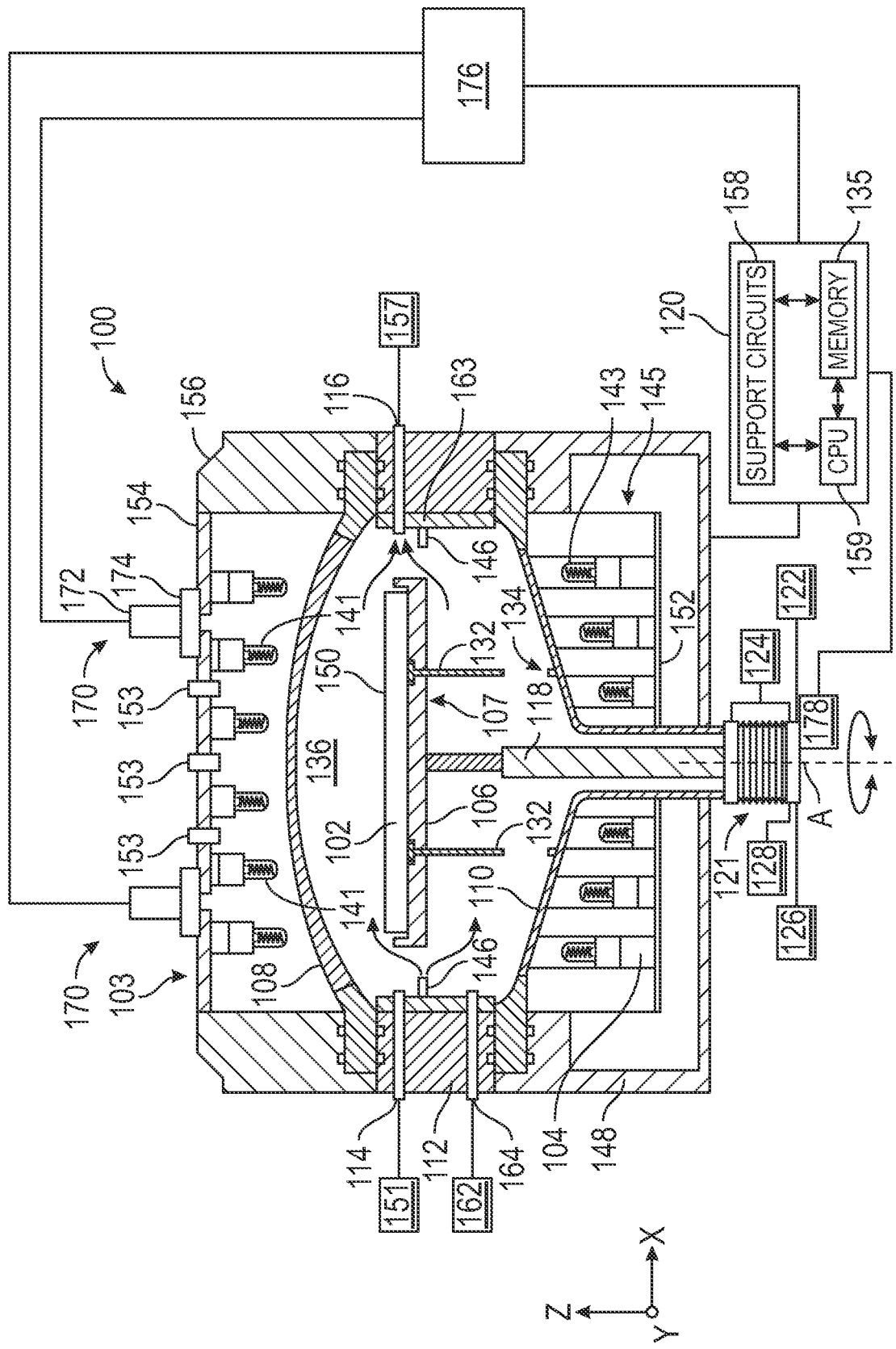
FIG. 1A is a schematic illustration of a deposition chamber, according to one embodiment of the disclosure.

The present disclosure generally relates to apparatus and methods for semiconductor processing, more particularly, to a thermal process chamber and spot heater utilization. More specifically, the present disclosure is directed towards spot heaters utilized in an epitaxial deposition chamber and methods of utilizing spot heaters to improve film growth uniformity on a substrate. In some instances, non-uniformities in precursor flow rate and the structure of substrate supports cause non-uniform film growth on the substrate within the process chamber. Non-uniformities in the radial direction from a center of the substrate may be corrected by utilizing a spot heater to deliver concentrated radiation beam exposure to annular rings on the substrate. In some embodiments, the spot heaters include actuating bases and expose the substrate to radiation in a pattern other than an annular ring. However, it has been found there is also non-uniform film grown at different angular positions on the same radial position on the substrate.

Embodiments described herein enable the amount of radiation delivered by one or more spot heaters to the substrate to be continuously adjusted as the angular position of the substrate relative to the radiation beam changes. Therefore, the spot heaters may be used to correct non-uniform film growth at different angular positions on the substrate by delivering larger amounts of radiation to cool spots and smaller amounts of radiation to hot spots on the substrate. In some embodiments, local thickness variations on the substrate are corrected by etching excess material following deposition. During the etch operation, spot heating localized portions of the substrate may increase material removal rates and assist in improving overall profile uniformity.

In some embodiments, localized and variable spot heating is used to improve uniformity of selective growth operations. Selective growth is utilized to grow a single material only over desired exposed semiconductor areas, but not over adjacent areas, such as dielectric areas. Subsequent the selective growth operations, any film growth on undesired areas, such as dielectric areas, is removed in an etch back operation.

The selective heating of different angular positions on the substrate may therefore account for thermal non-uniformities introduced by the substrate support or for non-uniformities in precursor flow. The methods described herein may further reduce the amount of substrate support components rejected due to manufacturing variation. Substrate outputs of different process chambers, such as the deposition chambers described herein, may also be more closely matched while in the field. Therefore, thickness and material composition differences between substrates processed in different process chambers are reduced while using several process chambers in the same high volume manufacturing process.

Adjusting the amount of radiation delivered to different portions is performed using a plurality of temperature correction factors. The temperature correction factors are determined by measuring a layer deposition thickness deposited on a test substrate during maintenance operations of the process chamber. The layer deposition thickness measurements are then used to determine the temperature correction factors. The temperature correction factors are applied during subsequent substrate processing operations within the process chamber and determine the amount of power delivered to the spot heaters and the subsequent spot heater signal (radiation delivery) to the substrate, such that the spot heater signal is continuously varied as the relative angular position of the substrate from the radiation beam and the spot heater changes.

FIG. 1A is a schematic illustration of a type of process chamber 100 according to one embodiment of the present disclosure. The process chamber 100 is a deposition chamber, such as an epitaxial deposition chamber. The process chamber 100 is utilized to grow an epitaxial film on a substrate, such as the substrate 102. The process chamber 100 creates a cross-flow of precursors across the top surface 150 of the substrate 102.

The process chamber 100 includes an upper body 156, a lower body 148 disposed below the upper body 156, a flow module 112 disposed between the upper body 156 and the lower body 148. The upper body 156, the flow module 112, and the lower body 148 form a chamber body. Disposed within the chamber body is a substrate support 106, an upper dome 108, a lower dome 110, a plurality of upper lamps 141, and a plurality of lower lamps 143. As shown, a controller 120 is in communication with the process chamber 100 and is used to control processes, such as those described herein. The substrate support 106 is disposed between the upper dome 108 and the lower dome 110. The plurality of upper lamps 141 are disposed between the upper dome 108 and a lid 154. The lid 154 includes a plurality of sensors 153 disposed therein for measuring the temperature within the process chamber 100. The plurality of lower lamps 143 are disposed between the lower dome 110 and a floor 152. The plurality of lower lamps 143 form a lower lamp assembly 145.

A processing volume 136 is formed between the upper dome 108 and the lower dome 110. The processing volume 136 has the substrate support 106 disposed therein. The substrate support 106 includes a top surface on which the substrate 102 is disposed. The substrate support 106 is attached to a shaft 118. The shaft 118 is connected to a motion assembly 121. The motion assembly 121 includes one or more actuators and/or adjustment devices that provide movement and/or adjustment of the shaft 118 and/or the substrate support 106 within the processing volume 136. The motion assembly 121 includes a rotary actuator 122 that rotates the shaft 118 and/or the substrate support 106 about a longitudinal axis A of the process chamber 100. The motion assembly 121 further includes a vertical actuator 124 to lift and lower the substrate support 106 in the z-direction. The motion assembly includes a tilt adjustment device 126 that is used to adjust the planar orientation of the substrate support 106 and a lateral adjustment device 128 that is used to adjust the position of the shaft 118 and the substrate support 106 side to side within the processing volume 136.

The substrate support 106 may include lift pin holes 107 disposed therein. The lift pin holes 107 are sized to accommodate a lift pin 132 for lifting of the substrate 102 from the substrate support 106 either before or after a deposition process is performed. The lift pins 132 may rest on lift pin stops 134 when the substrate support 106 is lowered from a processing position to a transfer position.

The flow module 112 includes a plurality of process gas inlets 114, a plurality of purge gas inlets 164, and one or more exhaust gas outlets 116. The plurality of process gas inlets 114 and the plurality of purge gas inlets 164 are disposed on the opposite side of the flow module 112 from the one or more exhaust gas outlets 116. One or more flow guides 146 are disposed below the plurality of process gas inlets 114 and the one or more exhaust gas outlets 116. The flow guide 146 is disposed above the purge gas inlets 164. A liner 163 is disposed on the inner surface of the flow module 112 and protects the flow module 112 from reactive gases used during deposition processes. The process gas inlets 114 and the purge gas inlets 164 are positioned to flow a gas parallel to the top surface 150 of a substrate 102 disposed within the processing volume 136. The process gas inlets 114 are fluidly connected to a process gas source 151.

The purge gas inlets 164 are fluidly connected to a purge gas source 162. The one or more exhaust gas outlets 116 are fluidly connected to an exhaust pump 157. Each of the process gas source 151 and the purge gas source 162 may be configured to supply one or more precursors or process gases into the processing volume 136.

One or more spot heaters 170 are disposed on top of the lid 154. In some embodiments, there are a plurality of spot heaters 170 disposed on top of the lid 154, such as two spot heaters 170, such as three spot heaters 170, or such as four spot heaters 170. Each of the spot heaters 170 include a focused radiation delivery unit 172 and a holder 174. The focused radiation delivery unit 172 is mechanically coupled to the holder 174, such that the holder 174 is used to attach the radiation delivery unit 172 to the lid 154. The holder 174 is configured to adjust the orientation of the focused radiation delivery unit 172. In some embodiments, the holder 174 is configured to re-orient the radiation delivery unit 172 between process operations or periodically during a single process operation.

The focused radiation delivery unit 172 includes one of a laser or a focused lamp. In some embodiments, the laser is an end of an optical fiber and the laser source is disposed separate from the one or more spot heaters 170, such as within a spot heater control box 176. The focused radiation delivery unit 172 may include one or more optical elements, such as a mirror, a lens, or a metasurface device. The optical elements may assist in increasing or decreasing the concentration of radiation of a radiation beam emitted from the one or more spot heaters 170 towards the substrate 102.

The one or more spot heaters 170 are configured to emit radiation beams with a diameter of less than about 25 mm, such as less than about 20 mm, such as less than about 10 mm, such as less than about 5 mm, such as less than about 3 mm, such as less than about 2 mm. Each spot on the substrate 102 which is exposed at once is exposed to a power range of about 0.5 W to about 100 W, such as about 1 W to about 100 W, such as about 2 W to about 100 W. Adjusting the size of the spot on the substrate 102 which is exposed also adjusts the power density of the exposure. Therefore, the power density of each of the radiation beams as the radiation beam intersects the top surface 150 of the substrate 102 is configured to be greater than about 2 W/cm$^2$, such as greater than about 3 W/cm$^2$, such as greater than about 5 W/cm$^2$, such as about 5 W/cm$^2$ to about 1500 W/cm$^2$, such as about 5 W/cm$^2$ to about 500 W/cm$^2$, such as about 5 W/cm$^2$ to about 300 W/cm$^2$. The power density is high enough to influence the growth rate and composition of the film being grown, while small enough to prevent the wafer and susceptor from being damaged.

Each of the one or more spot heaters 170 are directed towards different portions of the substrate 102, such that a first spot heater 170 is directed at a first radial position of the substrate 102, while a second spot heater 170 is directed at a second radial position of the substrate 102.

The spot heater control box 176 is configured to provide power to each of the spot heaters 170, such that the spot heater control box 176 provides power and/or radiation to the spot heaters 170 through one or more wires or fiber optics. The spot heater control box 176 may include a variable voltage or ampere source to control the strength of the radiation beam of each of the one or more spot heaters 170. The spot heater control box 176 further includes one or more laser sources. The laser sources are configured to emit a laser with a wavelength of about 700 nm to about 2000 nm, such as about 750 nm to about 1800 nm, such as about 760 nm to about 1700 nm.

Figure 1B:
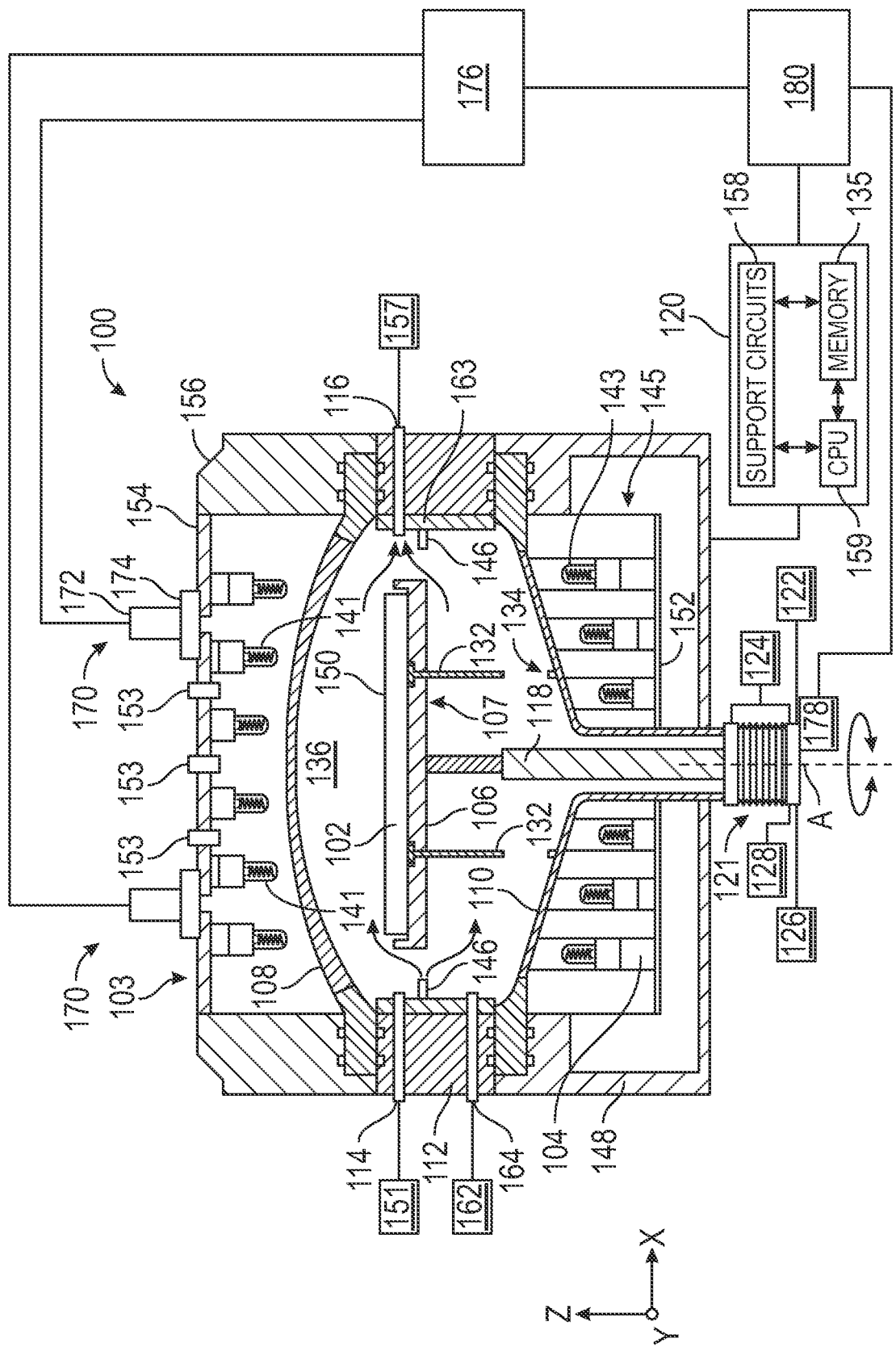
FIG. 1B is a schematic illustration of a deposition chamber, according to another embodiment of the disclosure.

An angular position sensor 178 is disposed within the process chamber 100 and is configured to determine an angular position of one or both of the substrate 102 and the substrate support 106. In the embodiments of FIGS. 1A and 1B, the angular position sensor 178 is disposed adjacent to the shaft 118 and is configured to measure the angular position of the shaft 118 relative to the longitudinal axis A. The angular position sensor 178 may be configured to measure when one or more signalers on the shaft 118 pass by a sensing path of the angular position sensor 178. In some embodiments, the one or more signalers include a notch, a bar code, a reflector, or a bump on the side of the shaft 118. The angular position sensor 178 may be an optical position sensor or a resistive position sensor.

In some embodiments, the angular position sensor 178 is located within the flow module 112 or above the substrate support 106, such as disposed through the lid 154 as one of the sensors 153. The angular position sensor 178 may then be configured to measure a notch location within the edge of the substrate 102 or a notch in the substrate support 106. The angular position sensor 178 is coupled to one of the controller 120 or a microcontroller, such as the microcontroller 180 of FIG. 1B.

The controller 120 includes a central processing unit (CPU) 159, a memory device 135, and support circuits 158. The controller 120 may control the process chamber 100 directly, or via other computers or controllers, such as the spot heater control box 176 or a microcontroller 180 (FIG. 1B), associated with particular support system components. The controller 120 may be one of any form of general-purpose computer processor that can be used in an industrial setting for controlling various chambers and sub-processors. The support circuits 158 include cache, power supplies, clock circuits, input/output circuitry and subsystems, and the like. Processing steps may be stored in the memory device 135 as a software routine that may be executed or invoked to turn the controller 120 into a specific purpose controller to control the operations of the process chamber 100. The controller 120 may be configured to perform any methods described herein.

To facilitate control of the spot heaters 170 and associated radiation delivery to the substrate 102, the CPU 159 may be one of any form of general purpose computer processor that can be used in an industrial setting, such as a programmable logic controller (PLC), for controlling various chambers and sub-processors. The memory device 135 is coupled to the CPU 159 and the memory device 135 is non-transitory and may be one or more of readily available memory such as random access memory (RAM), read only memory (ROM), floppy disk drive, hard disk, or any other form of digital storage, local or remote. Support circuits 158 are coupled to the CPU 159 for supporting the processor in a conventional manner. The process gas flow and heating instructions are generally stored in the memory device 135, typically as a software routine. The software routine may also be stored and/or executed by a second CPU that is remotely located from the hardware being controlled by the CPU.

The memory device 135 is in the form of computer-readable storage media that contains instructions, that when executed by the CPU 159, facilitates the operation of the spot heaters 170. The instructions in the memory device 135 are in the form of a program product such as a program that implements the methods of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein).

In certain embodiments, the program(s) embody machine learning capabilities. Various data features include process parameters such as processing times, temperatures, pressures, voltages, polarities, powers, gas species, precursor flow rates, and the like. Relationships between the features are identified and defined to enable analysis by a machine learning algorithm to ingest data and adapt processes being performed by the process chamber 100 and the spot heaters 170. The machine learning algorithms may employ supervised learning or unsupervised learning techniques. Examples of machine learning algorithms embodied by the program include, but are not limited to, linear regression, logistic regression, decision tree, state vector machine, neural network, naïve Bayes, k-nearest neighbors, K-Means, random forest, dimensionality reduction algorithms, and gradient boosting algorithms, among others.

Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure. In some embodiments, the controller 120 is an etherCAT controller.

FIG. 1B is a schematic illustration of another embodiment of the process chamber 100. In the embodiment of FIG. 1B, a microcontroller 180 is utilized to control the spot heaters 170, such that the microcontroller is coupled to both the spot heater control box 176 and the angular position sensor 178. The microcontroller 180 is further coupled to the controller 120, such that the microcontroller 180 separates control of the spot heaters 170 from the controller 120, but still received input or power from the primary controller 120. The microcontroller 180 may be similar to the controller 120 and include a CPU, memory, and support circuits.

A dedicated microcontroller, such as the microcontroller 180 provides more rapid response times and avoids signal latency over a large controller network, such as the controller 120. The controller 120 sends control signals to many different components and devices on a network while receiving signals from many sensors within the process chamber 100. It is estimated cycle times using a simple microcontroller reduces possible cycle times to less than 1 microsecond. Cycle times when utilizing the microcontroller 180 are therefore up to at least 1000 times faster.

Faster cycle times enables more precise control of spot heating over the substrate 102. With shorter times between successive signals to the lasers, the power can be modulated faster, such that very small angular position changes of the substrate 102 may receive different exposure power levels. Even at high wafer/susceptor rotation speeds, precise exposure level control is possible when a control time is reduced with a microcontroller.

Figure 2:
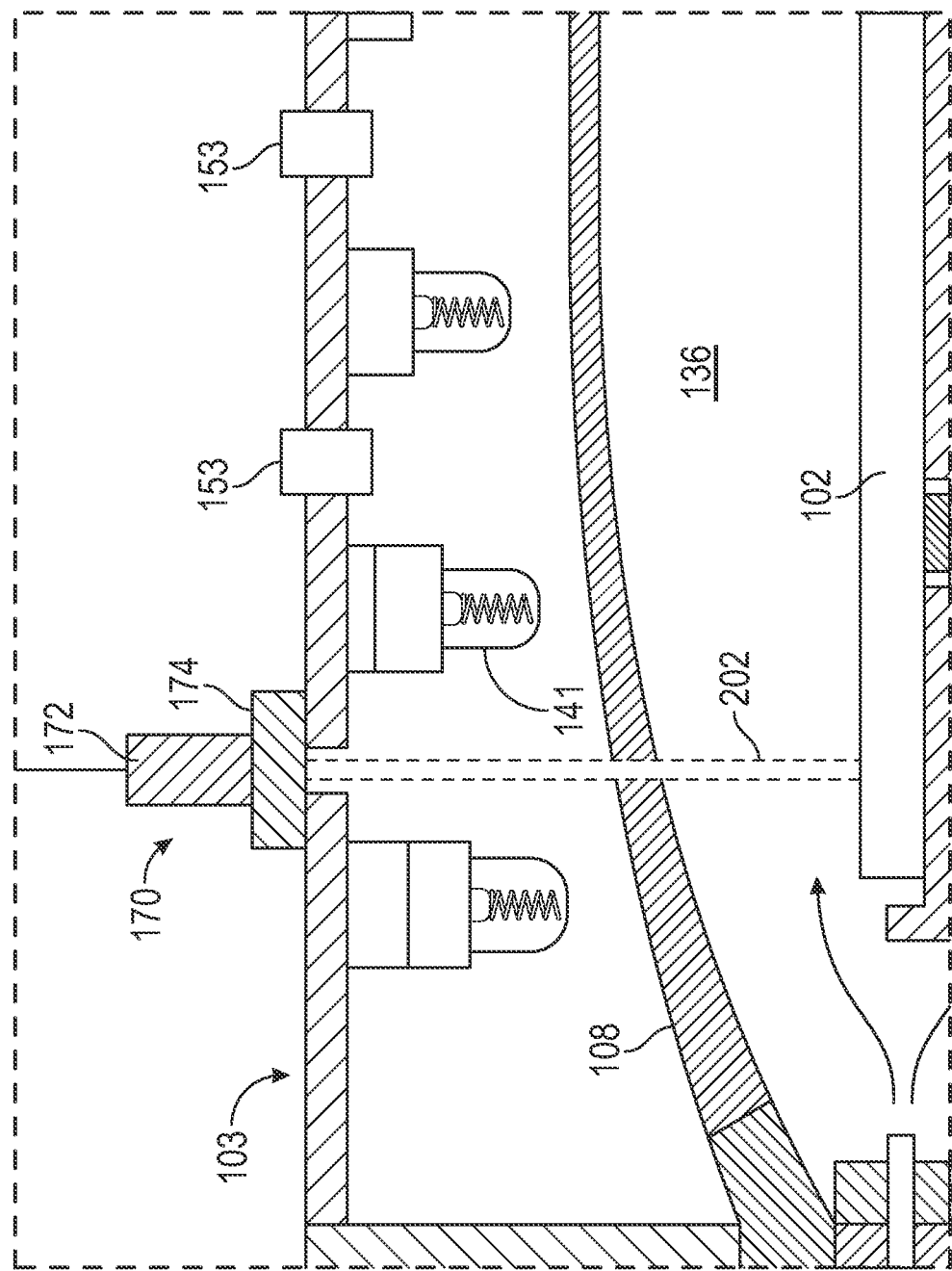
FIG. 2 is a schematic illustration of a spot heater disposed on the deposition chamber of either of FIG. 1A or FIG. 1B, according to one embodiment of the disclosure.

FIG. 2 is a schematic illustration of a spot heater 170 disposed on the process chamber 100 of either of FIG. 1A or FIG. 1B. The spot heater 170 is further illustrated with a radiation beam 202 directed from the spot heater 170 to the top surface 150 of the substrate 102. As described herein, the diameter of the radiation beam 202 is less than about 10 mm, such as less than about 5 mm, such as less than about 3 mm, such as less than about 2 mm at the point of contact with the substrate 102 and/or the substrate support 106.

Figure 3:
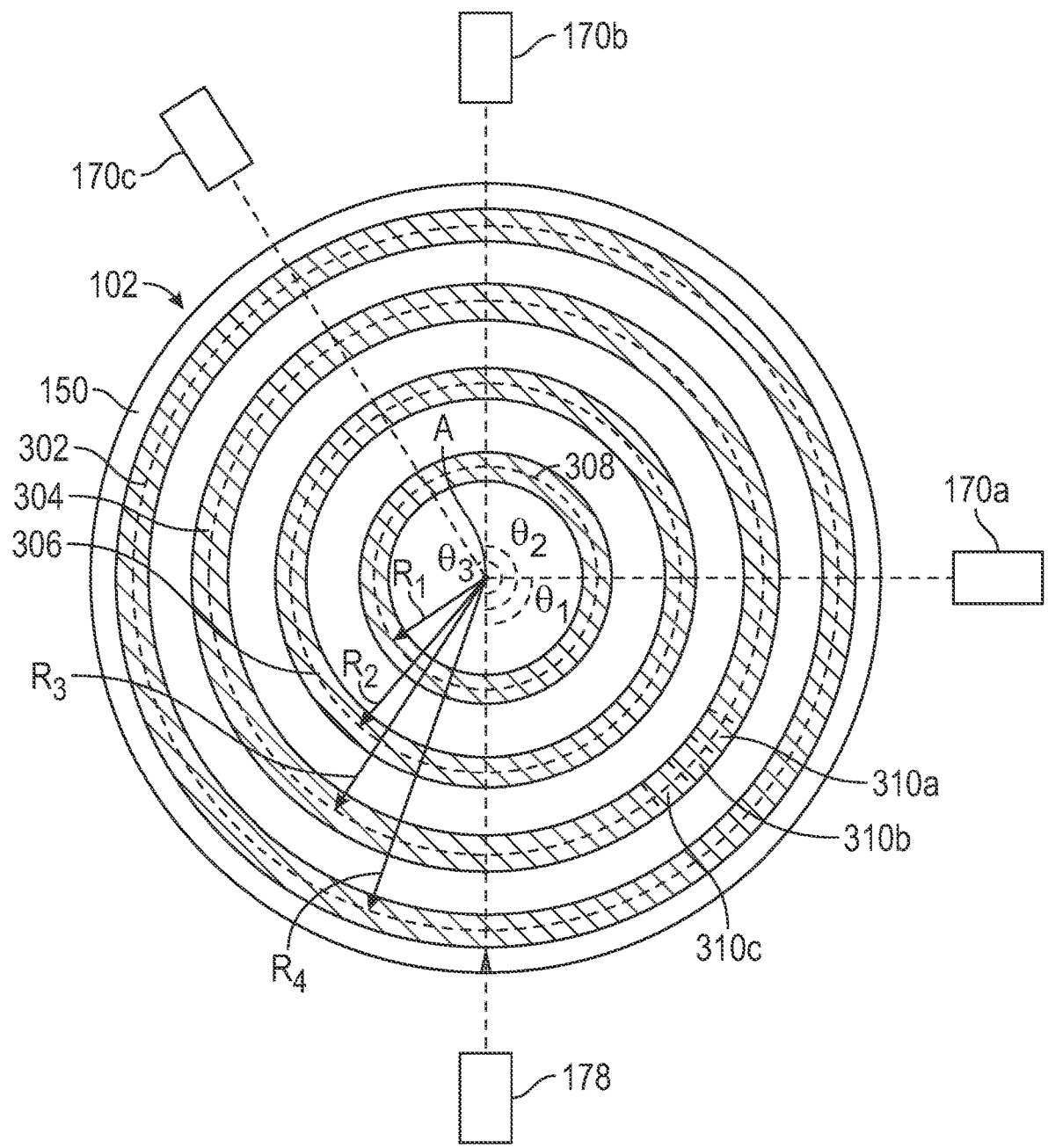
FIG. 3 is a schematic plan view of spot heating exposure paths, according to one embodiment of the disclosure.

FIG. 3 is a schematic plan view of spot heater exposure paths 302, 304, 306, 308 on the top surface 150 of the substrate 102. The spot heater exposure paths 302, 304, 306, 308 are formed using one or more spot heaters 170, such as one of a first spot heater 170a, a second spot heater 170b, or a third spot heater 170c. Each of the spot heater exposure paths 302, 304, 306, 308 are disposed at different radial positions on the substrate 102 from the axis A. The spot heater exposure paths 302, 304, 306, 308 include a first spot heater exposure path 302, a second spot heater exposure path 304, a third spot heater exposure path 306, and a fourth spot heater exposure path 308. Each of the spot heater exposure paths 302, 304, 306, 308 include a centerline which is the center of the annular portion of the spot heater exposure paths 302, 304, 306, 308.

Each of the spot heater exposure paths 302, 304, 306, 308 are disposed at different radial positions, such that the first spot heater exposure path 302 is disposed a first radial distance $R_1$ from the axis A of the substrate 102, the second spot heater exposure path 304 is disposed a second radial distance $R_2$ from the axis A of the substrate 102, the third spot heater exposure path 306 is disposed a third radial distance $R_3$ from the axis A of the substrate 102, and the fourth spot heater exposure path 308 is disposed a fourth radial distance $R_4$ from the axis A of the substrate 102. The fourth radial distance $R_4$ is greater than the third radial distance $R_3$. The third radial distance $R_3$ is greater than the second radial distance $R_2$. The second radial distance $R_2$ is greater than the first radial distance $R_1$.

The angular position sensor 178 is shown at a first angular position around the axis A of the substrate 102. In some embodiments, the angular position sensor 178 is disposed at a zero angular position around the axis A. Although the angular position sensor 178 is disposed radially outward of the substrate 102 for clarity, it is understood the angular position sensor 178 may be disposed below the substrate 102 or above the substrate 102 and radially inward of the outer circumference of the substrate 102.

The first spot heater 170a is disposed at a first angle $\theta_1$ with respect to the angular position sensor 178 around the axis A. The second spot heater 170b is disposed at a second angle $\theta_2$ with respect to the angular position sensor 178 around the axis A. The third spot heater 170c is disposed at a third angle $\theta_3$ with respect to the angular position sensor 178 around the axis A. The first angle $\theta_1$, the second angle $\theta_2$, and the third angle $\theta_3$ are exemplary and may be different angles than those illustrated. The first angle $\theta_1$ is at an angle of about 90 degrees (°). The second angle $\theta_2$ is at an angle of about 180°. The third angle $\theta_3$ is at an angle of about 210°.

Each of the spot heater exposure paths 302, 304, 306, 308 are split into a plurality of sectors 310a, 310b, and 310c. The plurality of sectors 310a, 310b, and 310c are portions of the spot heater exposure paths 302, 304, 306, 308 at different angular positions. Therefore, a first angular position of the second spot heater exposure path 304 is a first sector 310a. A second angular position of the second spot heater exposure path 304 is a second sector 310b. A third angular position of the second spot heater exposure path 304 is a third sector 310c. A plurality of additional sectors are disposed at other angular positions on the second spot heater exposure path 304. Each of the first spot heater exposure path 302, the third spot heater exposure path 306, and the fourth spot heater exposure path 308 are spit into similar sectors at different angular positions.

In embodiments in which the holder 174 of the spot heaters 170 includes a motorized base, the radial position of the spot heating exposure paths may be continuously varied during each 360-degree rotation of the substrate 102. The range of the radial position variation is limited to about 5 to about 10 mm depending on wafer rotation speed and the motorized base motor speed. The motorized base therefore enables non-spherical spot heating exposure path on the substrate 102. In some embodiments, the spot heating exposure paths are therefore ovoid or parabolic in shape. The non-spherical spot heating exposure paths enable greater versatility in spot heating application.

In some embodiments, one of the spot heating exposure paths, such as the first spot heating exposure path 302, could even be at a radial position outside of the substrate 102, but close to the edge of the substrate 102. Due to thermal diffusion, spot heating a region outside of the circumference of the substrate 102 still provides heating to the edge of the substrate 102. Spot heating the region outside of the circumference of the substrate 102 may therefore be utilized to target thickness and composition variations of a film at primarily the edge of the substrate 102, while having limited to no effect on an interior of the substrate 102. In some embodiments, the spot heating exposure path is within 10 mm of the outer circumference of the substrate, such as less than 10 mm from the outer circumference of the substrate, such as less than 5 mm from the outer circumference of the substrate.

Figure 4:
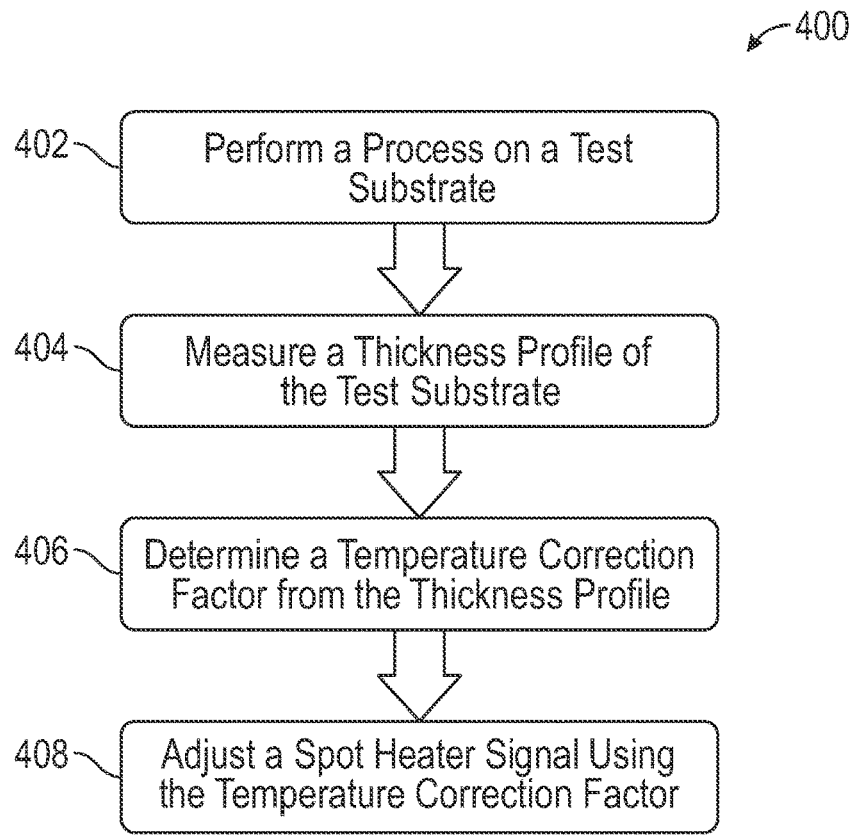
FIG. 4 is a flow chart of a method of determining adjusted spot heater strength to improve film uniformity on a substrate.

FIG. 4 is a flow chart of a method 400 of determining adjusted spot heater strength to improve film uniformity on a substrate, such as the substrate 102. The method 400 is stored in one of the controller 120 in the embodiment of FIG. 1A or a microcontroller 180 in the embodiments of FIG. 1B. The controller 120 and/or the microcontroller 180 are configured to execute the method 400 as stored therein. The method 400 includes controlling the spot heaters 170 and the spot heater control box 176.

The method 400 first determines the amount of correction desired at a plurality of points on the substrate before applying the correction to the spot heaters 170. A process, such as depositing a layer, is performed on a test substrate during an operation 402. The process is one of a layer deposition process, an etch process, or a thermal treatment process. The substrate is a test substrate, but is similar in size, shape, and composition to other substrates which are to be processed within the process chamber. Depositing or etching a layer on the test substrate is temperature dependent and temperature non-uniformities within the substrate will cause non-uniform film thicknesses on the test substrate. Temperature non-uniformities further cause differences in material and elemental composition of the layer across the profile of a substrate.

A thickness or material composition profile of the test substrate is measured during another operation 404 after depositing or etching the layer on the substrate. Due to temperature discrepancies causing the non-uniform film thickness formation and non-uniform material composition, the thickness profile and/or the material composition profile are utilized to determine estimated temperature profiles on the substrate. Therefore, where there is less layer deposition, the temperature at that location is less than the temperature at a location where there is more layer deposition. The material composition may additionally be utilized to determine a processing temperature at various locations on the substrate, such that higher or lower material concentrations indicate a higher or lower processing temperature at a specific location.

The thickness or material composition profile may be measured by moving the test substrate into a separate process chamber. The separate process chamber is configured to measure one or both of the thickness profile and the material composition profile of the test substrate. The thickness profile is measured using one of a non-contact or a contact thickness measurement device. Non-contact thickness measurement devices include a camera, an ellipsometer, or an x-ray diffraction device. Contact thickness measurement devices include a line scanning tool. The ellipsometer measures changes in optical properties of one or more light beams reflected off of the surface of the test substrate to measure material thickness. The thickness measurement device obtains a thickness profile of the test substrate. In some embodiments, the thickness measurement device is disposed inside of a transfer chamber, a load-lock chamber, or a factory interface (not shown) mechanically coupled to the process chamber. In some embodiments, the thickness measurement device is located in an in-line tool which is not coupled to the process chamber.

The material composition of the film across the surface of the test substrate is measured with non-contact methods that include ellipsometry and x-ray diffraction. For layers containing some dopants, such as Boron, Phosphorus, etc., that have a large effect on electrical properties, either resistivity or carrier concentration measurements (e.g. Hall effect measurements) are used to determine composition of the film. Such composition data (composition vs. position) is then utilized to form a concentration plot or graph similar to the example thickness profile shown in FIG. 6.

Figure 6:
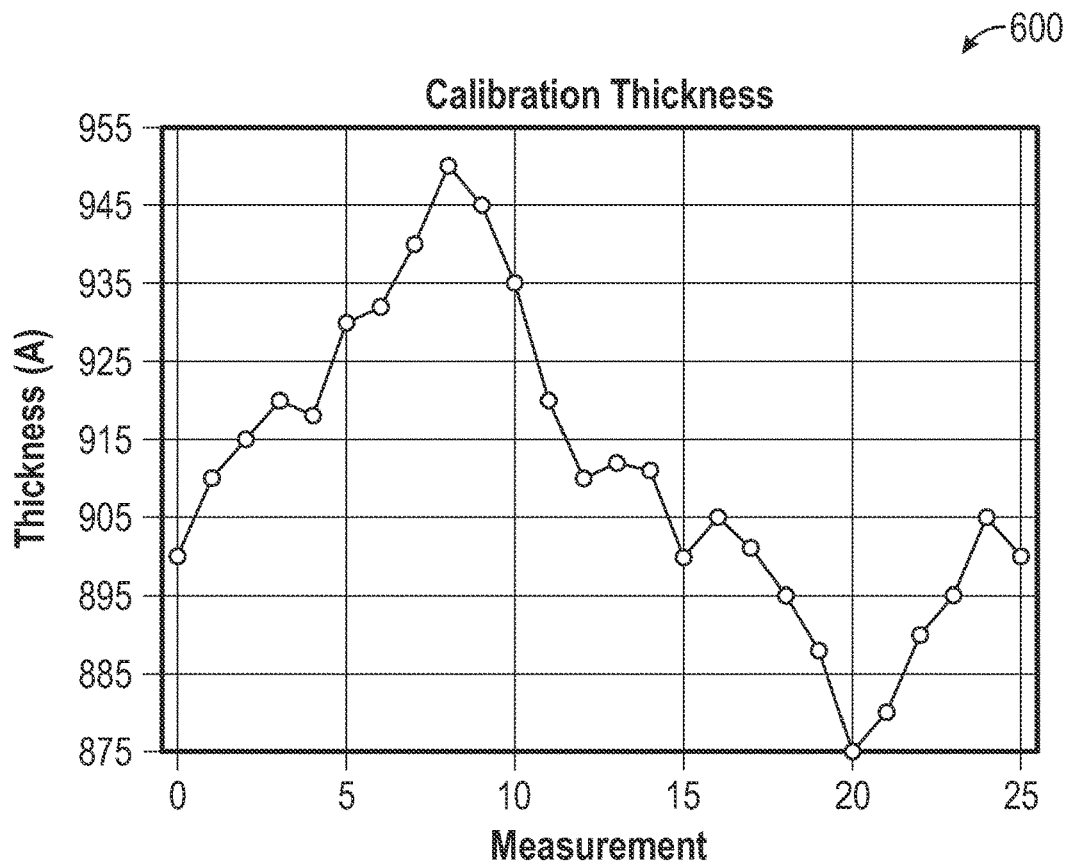
FIG. 6 is a graph illustrating film growth thickness measured on a substrate during a calibration operation.

In some embodiments, thickness and/or material composition profiles are only obtained for specific radial locations on the substrate. In one example, the thickness and/or material composition profile is obtained for a radial location greater than 20 mm from the center of the substrate. The thickness profile and/or material composition includes a plurality of thickness and/or material composition measurements at a single radial position, such as greater than 5 thickness and/or material composition measurements, such as greater than 10 thickness and/or material composition measurements, such as greater than 15 thickness and/or material composition measurements, such as greater than 20 thickness and/or material composition measurements. FIG. 6 illustrates a graph 600 with a plurality of thickness measurement values. The graph 600 includes 26 thickness measurements along a single radial location on the substrate. The thickness is measured in Angstroms (A) and varies between about 875 A to about 950 A. In the embodiment of FIG. 6, the zero (0) measurement is the same point on the substrate as the 26 measurement and each measurement therebetween is a measurement of a different angular position on the substrate at the same radial location.

Once the thickness and/or material composition profile of the substrate is obtained during the operation 404, a temperature correction factor is determined from the thickness and/or material composition profile during an operation 406. The temperature correction factor is dependent on the amount of correction desired, the growth rate of the films on the substrate at different temperatures, the temperature of the process chamber, and the power of the spot heaters. The temperature correction factor is obtained by inverting the thickness profile and/or material composition profile measurement values and normalizing the thickness profile and/or material composition profile measurement values. Inverting the thickness profile and/or material composition profile measurement values includes subtracting each thickness value and/or material composition value from a first thickness value or a first material composition value. In some embodiments, the first thickness value and/or first material composition value is the maximum thickness value and/or maximum material composition value of the thickness profile measurement values and/or material composition measurement values. Normalizing the thickness profile measurement values and/or material composition measurement values includes dividing the inverted thickness profile measurement values and/or material composition measurement values by the maximum of the inverted thickness profile measurement values and/or material composition measurement values. Interpolation is then performed on the normalized thickness profile measurement values or material composition profile measurement values to obtain a normalized correction factor curve.

Figure 7:
FIG. 7 is a graph illustrating correction factors to reduce the film growth non-uniformities of FIG. 6.

The interpolation of the normalized thickness profile measurement values and/or material composition profile measurement values may be one of a linear, quadratic, or a cubic interpolation. The normalized correction factor curve is then multiplied by a correction multiplier value to obtain a temperature correction curve. The correction multiplier value is at least partially dependent on the other process conditions within the process chamber during deposition and/or etching within the substrate. In one example, the correction multiplier value is 4095 for a 12 bit correction value. The graph 700 of FIG. 7 illustrates one example of a temperature correction curve obtained as described in operation 406. In some examples, the correction factor values are equivalent to a difference in power applied to a spot heater, such as a difference in wattage or joules emitted by the spot heater or by a laser coupled to the spot heater.

After determining the temperature correction factor curve and the temperature correction values, a signal output from one or more spot heaters is adjusted as determined by the temperature correction factor values during an operation 408. Adjusting the signal output of the one or more spot heaters is further described in a method 500 of FIG. 5. Determining the thickness profile, the material composition profile, and/or the temperature correction curve is performed during a maintenance procedure before processing of substrates within the process chamber 100.

Figure 5:
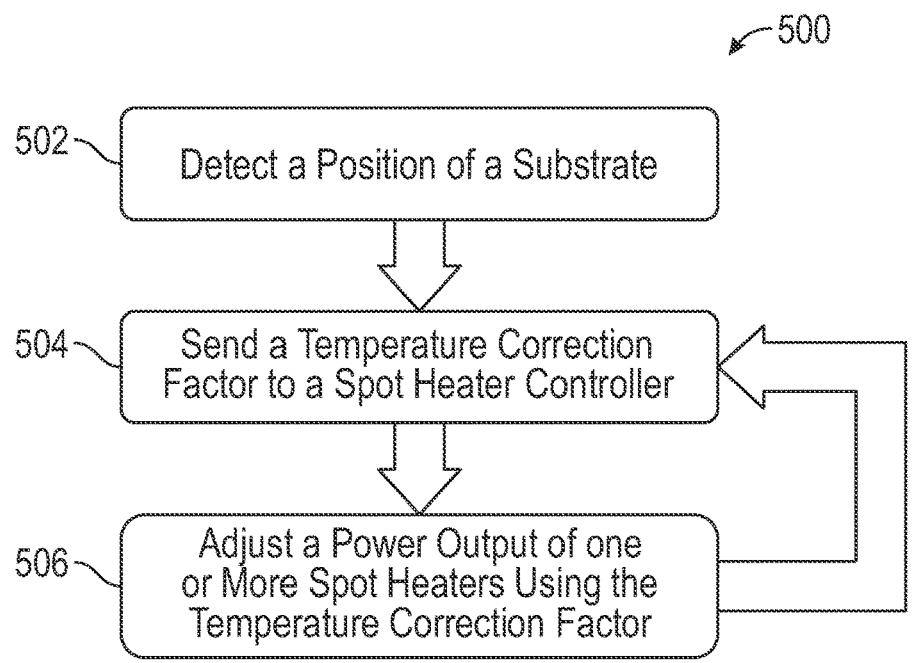
FIG. 5 is a flow chart of a method of processing a substrate while adjusting strength of a spot heater exposure.

FIG. 5 illustrates the method 500 of processing a substrate while adjusting strength of a spot heater exposure. The method 500 includes an operation 502 of detecting a position of the substrate. The position of the substrate which is detected during the operation 502 is the angular position of the substrate. The angular position is determined using a position sensor, such as the angular position sensor 178 of FIGS. 1A and 1B. The angular position is further determined by knowing the speed of rotation of the substrate support about the axis A. Detecting the position of the substrate assists in ensuring the temperature correction signal output by the spot heaters during later operations is delivered to the correct angular position of the substrate. In some embodiments, the position of the substrate is known by registering when a notch or signaler on the substrate or the substrate support passes the angular position sensor.

After the angular position of the substrate is determined during the operation 502, a temperature correction factor value and/or the temperature correction curve is provided to a spot heater controller. The spot heater controller may be one of the controller 120, the microcontroller 180, or the spot heater control box 176. The temperature correction factor value associated with a specific angular position of the substrate detected by the angular position sensor is provided to the spot heater controller.

In some embodiments, the spot heater controller already includes the temperature correction factor values and/or the temperature correction curve stored therein. However, the temperature correction factor value associated with the angular position of the substrate is recalled from the temperature correction factor value set of the temperature correction curve.

After the temperature correction factor value is recalled by the spot heater controller, either from internal spot heater controller memory or an external memory source, a signal output of one or more of the spot heaters is adjusted based off of the temperature correction factor value during an operation 506. Adjusting the signal output of the one or more spot heaters includes adjusting one or more of a power output, a wavelength output, a beam size, or a beam angle. In embodiments wherein the signal output is a power output, the power output is higher for larger temperature correction factor values and less for smaller temperature correction values. The amount of power delivered to the substrate is varied within a range, such as about 0% of total power of the spot heaters to 100% of the total power of the spot heaters, such as about 10% to about 95%, such as about 20% to about 95%. In some embodiments, the minimum power output by the spot heater during the operation 506 is about 2 $W/cm^2$, such that the power output delivered to a first angular section of the substrate is greater than about 2 $W/cm^2$, such as greater than about 5 $W/cm^2$, such as about 5 $W/cm^2$ to about 1500 $W/cm^2$, such as about 5 $W/cm^2$ to about 500 $W/cm^2$, such as about 5 $W/cm^2$ to about 300 $W/cm^2$. The range of power output by the spot heaters and delivered to the substrate is dependent on both the thickness variation range on the substrate to be corrected and the sensitivity of film growth thickness to power delivered to the substrate. In addition to correcting the thickness variation of the substrate, the material composition of the substrate is also able to be adjusted using the same processes.

The one or more spot heaters emit radiation beams with a diameter of less than about 25 mm, such as less than about 20 mm, such as less than about 10 mm, such as less than about 5 mm, such as less than about 3 mm, such as less than about 2 mm. Each spot on the substrate 102 which is exposed at once is exposed to a power range of about 0.5 W to about 100 W, such as about 1 W to about 100 W, such as about 2 W to about 100 W. Adjusting the size of the spot on the substrate 102 which is exposed also adjusts the power density of the exposure.

The wavelength of the radiation delivered to the substrate is about 700 nm to about 2000 nm, such as about 750 nm to about 1800 nm, such as about 760 nm to about 1700 nm As the spot heater is scanned over the substrate to expose different portions of the substrate, different temperature correction factors are applied. While the substrate is disposed at a first angular position as determined by the angular position sensor, a first temperature correction factor is provided to the spot heater controller. The first temperature correction factor is utilized to adjust a first output signal of a spot heater, such that a first angular section of the substrate is exposed to a first radiation beam with a first power. The first power is determined using the first temperature correction factor value. The first angular position may be a first sector, such as the first sector 310a, of an annulus, such as the second spot heater exposure path 304, of the substrate.

The substrate is then rotated to a second angular position of the same radial position. While at the second angular position, a second temperature correction factor value is provided to the spot heater controller. The second temperature correction factor is utilized to adjust a second output signal of the spot heater, such that a second angular section of the substrate is exposed to the second radiation beam with a second power. The second power is determined using the second temperature correction factor value. The second power is different from the first power when the second temperature correction factor is different from the first temperature correction factor. The second angular position may be a second sector, such as the second sector 310b, of the annulus, such as the second spot heater exposure path 304, of the substrate.

The substrate is then rotated to a third angular position of the same radial position. While at the third angular position, a third temperature correction factor value is provided to the spot heater controller. The third temperature correction factor value is utilized to adjust a third output signal of the spot heater, such that a third angular section of the substrate is exposed to the third radiation beam with a third power. The third power is determined using the third temperature correction factor value. The third power is different from the first power and the second power when the third temperature correction factor value is different from either of the first temperature correction factor value or the third temperature correction factor value. The third angular position may be a third sector, such as the third sector 310c, of an annulus, such as the second spot heater exposure path 304, of the substrate.

Additional angular positions are heated by the spot heater at different power values which correlate to additional temperature correction factor values. There may be greater than 10 angular positions with greater than 10 different power values, such as greater than 15 angular positions and greater than 15 different power values, such as greater than 20 angular positions and greater than 20 different power values. In some embodiments, over 100 temperature corrector factor values are determined from the temperature corrector curve. In some embodiments, there are over 200 temperature correction factor values, such as over 300 temperature correction factor values. In some embodiments, each angular position is a portion of an annulus, such that the annulus is broken into sectors with regions of less than 60 degrees, such as less than about 45 degrees, such as less than about 30 degrees, such as less than about 15 degrees, such as less than about 10 degrees, such as less than about 5 degrees, such as less than about 3 degrees, such as less than about 2 degrees, such as less than about 1 degree.

Figure 8A:
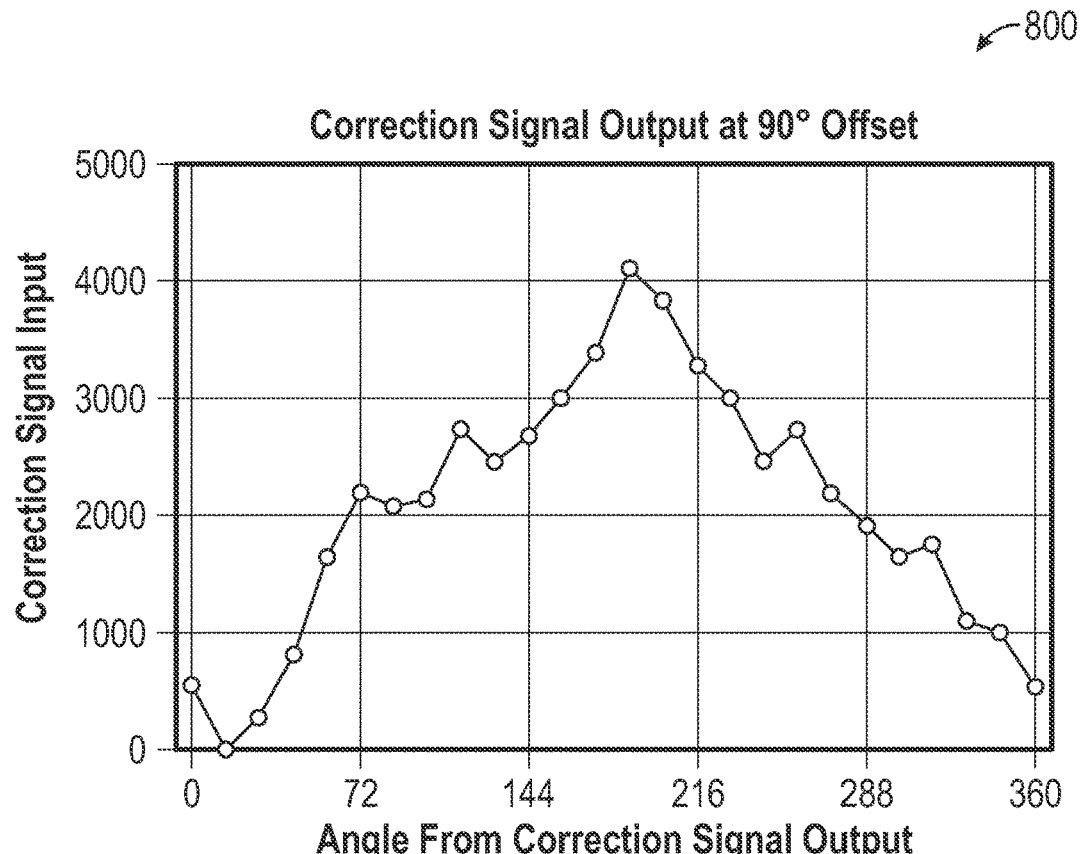
FIG. 8A is a graph illustrating a corrected signal output of a spot heater angularly offset from an angular position sensor by 90 degrees.
Figure 8B:
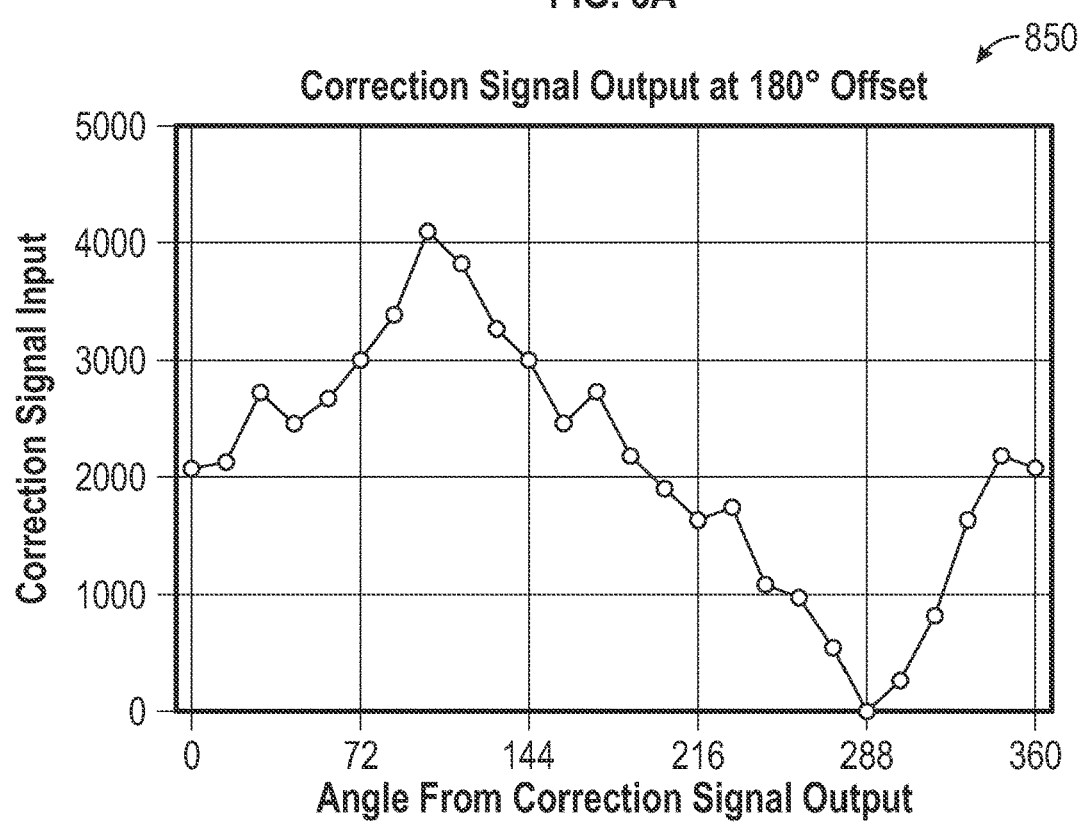
FIG. 8B is a graph illustrating a corrected signal output of a spot heater angularly offset from an angular position sensor by 180 degrees.

FIG. 8A is a graph 800 illustrating a corrected signal output of a spot heater angularly offset from an angular position sensor by 90 degrees. Therefore, the angle of the section of the spot heater exposure is offset from the angular position sensor by 90 degrees, similarly to the first spot heater 170a of FIG. 3. When the exposed region is disposed at an angle offset from the angle of the position sensor measurement, the correction signal output to the spot heater controller is similarly offset. As shown in FIG. 8B, the correction signal output and adjusted power output of the spot heater is adjusted by 90 degrees relative to the correction signal output if the location of the spot heater exposure was at the same angular position as the angular position sensor measurement.

FIG. 8B is a graph 850 illustrating a corrected signal output of a spot heater angularly offset from an angular position sensor by 180 degrees. Therefore, the angle of the section of the spot heater exposure is offset from the angular position sensor by 180 degrees, similarly to the second spot heater 170b of FIG. 3. As shown in FIG. 8B, the correction signal output and adjusted power output of the spot heater is adjusted by 180 degrees relative to the correction signal output if the location of the spot heater exposure was at the same angular position as the angular position sensor measurement.

The embodiments described herein enable the power applied to the substrate by one or more spot heaters to be varied as the spot heaters expose different angular regions of the substrate during processing. Adjusting the amount of radiation provided to the substrate for different angular regions enables non-uniformities at different angular regions to be reduced or eliminated. The change in power applied by the spot heaters is determined by a calibration operation where the thickness of a grown or etched film is measured. The thickness is correlated to temperature correction factor values which are graphed and used to interpolate a temperature correction factor curve. The temperature correction factor curve provides a curve which may be followed to adjust power and radiation quantities provided to the substrate at different angular positions.

While the foregoing is directed to embodiments of the present disclosure, other and further embodiments of the disclosure may be devised without departing from the basic scope thereof, and the scope thereof is determined by the claims that follow.

What is claimed is:

1. A method of adjusting a temperature profile of a substrate during processing, suitable for use during semiconductor manufacturing, comprising:
   sending a plurality of temperature correction factors to a spot heater controller, the plurality of temperature correction factors obtained by inverting a thickness profile or a plurality of material composition profile measurement values, and normalizing the thickness profile or the plurality of material composition profile measurement values;
   exposing a first angular section of the substrate to a first radiation beam with a first power using a spot heater, the first power determined using a first temperature correction factor of the plurality of temperature correction factors;
   rotating the substrate about a central axis; and
   exposing a second angular section of the substrate to a second radiation beam with a second power using the spot heater, the second power determined using a second temperature correction factor of the plurality of temperature correction factors, wherein the second power is different from the first power.

2. The method of claim 1, wherein both the first angular section and the second angular section are disposed the same radial distance from a center of the substrate.

3. The method of claim 1, wherein the substrate is rotated about a center of the substrate between the exposure of the first angular section and the exposure of the second angular section.

4. The method of claim 1, wherein the temperature correction factors are determined using a thickness or a composition of a film on a test substrate during a calibration operation.

5. The method of claim 1, further comprising determining a first angular position of the substrate using a position sensor configured to determine the first angular position of the substrate or a substrate support on which the substrate is disposed.

6. The method of claim 5, wherein the temperature correction factors are associated with an angular position of the substrate.

7. The method of claim 6, wherein the first power and the second power delivered to the first angular section and the second angular section respectively have a power density of greater than about 2 W/cm$^2$.

8. The method of claim 7, further comprising exposing a third angular section of the substrate to a third radiation beam with a third power using the spot heater, the third power determined using a third temperature correction factor of the plurality of temperature correction factors, wherein the third power is different from the first power and the second power.

9. A non-transitory computer-readable medium storing instructions that, when executed by a processor, cause a computer system to perform the steps of:
- determining an angular position of a substrate;
- receiving a temperature correction curve, the temperature correction curve formed using a plurality of temperature correction factors, the plurality of temperature corrections factors determined by measuring a film thickness or a material composition on a test substrate during a calibration operation, inverting the film thickness or the material composition, and normalizing the film thickness or the material composition; and
- adjusting a power output of one or more spot heaters using the temperature correction curve, such that the power output of the one or more spot heaters varies as the spot heaters heat a plurality of angular portions of the substrate along a first radial position of the substrate.

10. The medium of claim 9, wherein a radiation beam of the one or more spot heaters is directed towards the substrate and has a diameter of less than about 25 mm.

11. The medium of claim 9, wherein determining the angular position of the substrate is performed using a position sensor.

12. The medium of claim 11, wherein the one or more spot heaters are at a different angular position around the substrate than the position sensor and the temperature correction curve is offset to account for a difference between an angular position of position sensor relative to the substrate and the angular position of the one or more spot heaters relative to the substrate.

13. The medium of claim 9, wherein the power output of the one or more spot heaters is varied during a deposition operation within a process chamber and improves uniformity of a film being grown at a first radial location on the substrate at different angular positions on the substrate.

14. The method of claim 1, further comprising:
- exposing a third angular section of the substrate to a third radiation beam with a third power using the spot heater, the third power determined using a third temperature correction factor of the plurality of temperature correction factors, the third power different from the first power or the second power, wherein the third angular section is at a different radius of the substrate than the first angular section and second angular section.

15. The method of claim 1, wherein the spot heater comprises a motorized base.

16. The medium of claim 9, wherein the one or more spot heaters comprises a motorized base.

17. The medium of claim 9, further comprising:
- heating a second plurality of angular portions of the substrate along a second radial position of the substrate.

* * * * *